United States Patent [19]
Harwood et al.

[11] Patent Number: 6,120,304
[45] Date of Patent: Sep. 19, 2000

[54] ELECTRICAL CONTACTS FOR HOUSINGS

[75] Inventors: Alan R Harwood, Hayes; John R Parkin, Bransgore, both of United Kingdom

[73] Assignee: APW Electronics Limited, Eastleigh, United Kingdom

[21] Appl. No.: 09/190,610

[22] Filed: Nov. 12, 1998

[30] Foreign Application Priority Data

Nov. 12, 1997 [GB] United Kingdom ................... 9723902

[51] Int. Cl.[7] ............................ H01R 4/66; H01R 13/648
[52] U.S. Cl. ................................. 439/92; 439/816; 439/95
[58] Field of Search ................................ 439/92, 95, 108, 439/861, 607, 608, 609, 816; 361/424, 818

[56] References Cited

U.S. PATENT DOCUMENTS

| | | |
|---|---|---|
| 4,762,966 | 8/1988 | Kosanda . |
| 5,233,507 | 8/1993 | Gunther et al. . |
| 5,513,996 | 5/1996 | Annerino et al. . |

FOREIGN PATENT DOCUMENTS

| | | |
|---|---|---|
| 295 18 545 U | 2/1996 | Germany . |
| 297 06 673 U | 7/1997 | Germany . |
| 1 399 192 | 6/1973 | United Kingdom . |
| 2 254 490 | 10/1992 | United Kingdom . |
| WO 84/03180 | 8/1984 | WIPO . |

Primary Examiner—Renee Luebke
Assistant Examiner—Antoine Ngandjui
Attorney, Agent, or Firm—Oliff & Berridge, PLC

[57] ABSTRACT

A contact member is disclosed for providing electrical connection between two components of a housing for electrical or electronic equipment. The contact member comprises a spring clip for mounting the contact member over an edge of the first housing component. The spring clip has integrally connected front and rear portions for gripping the first housing component therebetween. The contact member also has a spring leaf integrally connected with the spring clip. The spring leaf has a generally U-shaped cross-section defined by a first contact portion, which extends away from the spring clip to the bight of the U at an acute angle to the first component when gripped by the spring clip, to contact the second housing component in use, and a second contact portion, which extends from the bight of the U back towards the spring clip, to contact the first housing component is use. The first and second contact portions are resiliently compressible towards one another to provide a resilient connection between the two housing components. A plurality of contact members may be integrally connected side by side to form a contact strip of the desired length.

15 Claims, 4 Drawing Sheets

ELECTRICAL CONTACTS FOR HOUSINGS

BACKGROUND OF THE INVENTION

1. Field of the Invention

This invention relates generally to electrical contacts for housings and more particularly to contact members for providing electrical connection between components such as doors, panels, frameworks etc. of housings for electrical or electronic equipment for example.

2. Description of the Related Art

Devices for electrically interconnecting components of a housing, for example to ensure that the housing provides proper shielding against transmission of electromagnetic radiation into or out of the housing, are well known. Such contact devices may be used to provide connections between panels of the housing or between panels and the framework, and also between doors and adjacent panels or frame elements. These contacts can be provided in the form of a elongate strip which can be mounted on a flange of one housing component and makes contact with an adjacent component to provide the required electrical connection between the components.

One such known contact device is illustrated in FIG. 1 of the drawings. FIG. 1 is a schematic cross-section through part of a door frame 1 of a housing for receiving the edge of a door 2 when the door is closed. The contact strip 3, also shown in cross-section, is mounted on a flange 4 of the door frame 1. The illustrated section of the contact strip 3 comprises a spring clip indicated generally at 5 for mounting the contact strip over the edge 6 of the flange 4. The spring clip 5 has a front clip portion 7 and a rear clip portion 8 which grip the flange 4 to hold the contact strip in place. A spring leaf 9 extends away from the spring clip 5 at an acute angle to the flange 4 and is bent, at bend 10, so as to extend back towards the flange 4 where the inwardly-turned, free end 11 of the spring leaf contacts the surface of the flange. The contact device 3 is formed as an elongate strip, extending over the height of the flange 4 in a direction perpendicular to the plane of the page. The contact strip is divided into individual contact members, each consisting of a spring clip and spring leaf, adjacent contact members being integrally connected side by side by a bridging portion. The front portion 7 of each spring clip 5 can be pressed from the material of the spring leaf 9 at periodic intervals along the length of the strip, whereby the complete contact strip can be formed by pressing and shaping a strip of sheet metal.

A rubber gasket 12 is mounted in the channel defined by the door frame 1 and provides a resilient stop for the door 2 when the door is fully closed. As the door closes in the direction of the arrow A in the figure, the edge of the door first contacts the spring leaf 9 at a point P. As the door continues to close, the edge of the door presses against spring leaf 9 compressing the leaf towards the flange 4. As the spring leaf 9 is compressed, the free end 11 of the spring leaf rides along flange 4 until the fully closed position, shown by the broken lines in the figure, is achieved.

It will be seen that in this process the free end 11 of the spring leaf 9 moves a distance X as the edge of the door 2 moves a distance Y from first contact point P to the final stop position at gasket 12. Since clearance must be provided for the forward travel X of spring leaf 9, the required distance of forward travel Y is relatively large. In particular, considering the door latching mechanism, only a limited amount of forward travel of the door 2 can be obtained from a 90° turn of a door handle, and this is often less than the required distance Y. The result is that after turning the handle to obtain a certain degree of forward movement, the door must be manually pushed through the remaining distance so that the edge of the door abuts the gasket 12 and the door is properly latched.

Another known contact strip is disclosed in GB-A-2254490. This contact strip provides for electrical connection of adjacent webs of front panels of a modular housing. The strip comprises a series of contact members each having a spring clip and spring leaf similar to the contact strip 3 of FIG. 1. In this case, however, (using the equivalent reference numerals of FIG. 1 for reference) the spring leaf 9 is bent at 10 to form an abutment strip which extends generally perpendicular to the flange (or web) 4. In this case, therefore, as the spring leaf is compressed towards the flange 4, the edge of the abutment strip on the spring leaf serves as a stop to abut the surface of flange 4 and limit the compressive movement of the spring leaf relative to the flange.

SUMMARY OF THE INVENTION

According to one aspect of the present invention there is provided a contact member for providing electrical connection between two components of a housing, the contact member comprising: a spring clip for mounting the contact member over an edge of a first housing component, the spring clip having integrally connected front and rear portions for gripping the first component therebetween; and a spring leaf integrally connected with the spring clip, the spring leaf having a generally U-shaped cross-section defined by a first contact portion, which extends away from the spring clip to the bight of the U at an acute angle to the first component when gripped by the spring clip, to contact the second housing component in use, and a second contact portion, which extends from the bight of the U back towards the spring clip, to contact the first housing component in use, wherein the first and second contact portions are resiliently compressible towards one another to provide a resilient connection between the two housing components.

The shape of the spring leaf in embodiments of the present invention provides improved resilience and can overcome the problem of the FIG. 1 arrangement described above. This will be explained in more detail below.

While applications may be envisaged where a single contact member embodying the invention is used on its own, more usually a plurality of the contact members, integrally connected side by side to form a contact strip, will be used. The invention therefore encompasses such a contact strip, and also a housing assembly comprising first and second housing components, a contact member or contact strip being mounted on one of the housing components and the other housing component being locatable in contact with the contact strip for electrically connecting the components.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENTS

Figure 2:
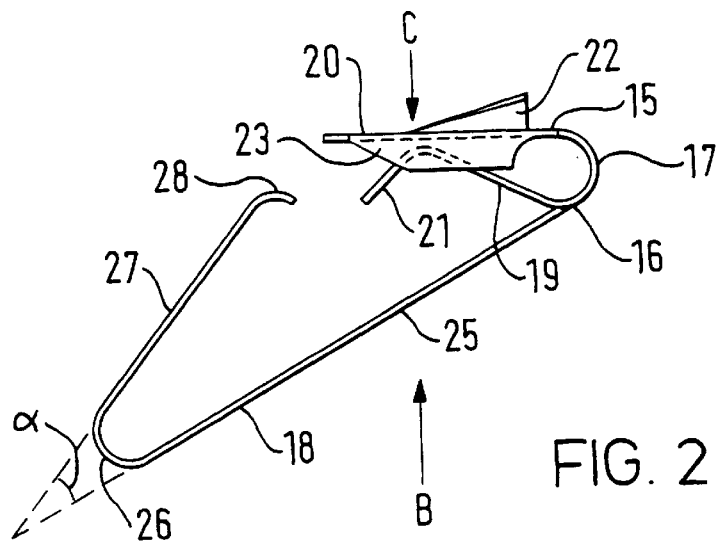
FIG. 2 is a cross-section of a contact strip embodying the present invention.

FIG. 2 is a schematic cross-section through a contact strip 15 embodying the invention taken at the junction between two adjacent contact members 16 of the strip so that the view shows one contact member 16 from the side. As shown, the contact member 16 comprises a spring clip indicated generally at 17 and a spring leaf indicated generally at 18. The spring clip 17 has a front clip portion 19 and a rear clip portion 20 for gripping a housing component on which the spring clip is mounted in use as described further below. The front clip portion 19 has an inclined end 21 to assist mounting of the spring clip. The rear clip portion 20 has a raised catch 22 the function of which will be described below. The rear clip portion 20 also has inwardly turned lateral sides 23 which serve as spacers as will be explained below.

The spring leaf 18 is generally U-shaped in cross-section. A first contact portion 25 of the spring leaf 18 extends from the spring clip 17 to the bight, or bend, 26 of the U. A second contact portion 27 of the spring leaf 18 extends from the bend 26 back towards the spring clip 17. The first and second contact portions 25, 27 are substantially planar in this embodiment except that the free end of the second contact portion 27 is curved inwardly at 28 towards the first contact portion 25. The first and second contact portions 25, 27 in this embodiment subtend an angle a of about 23°.

Figure 3:
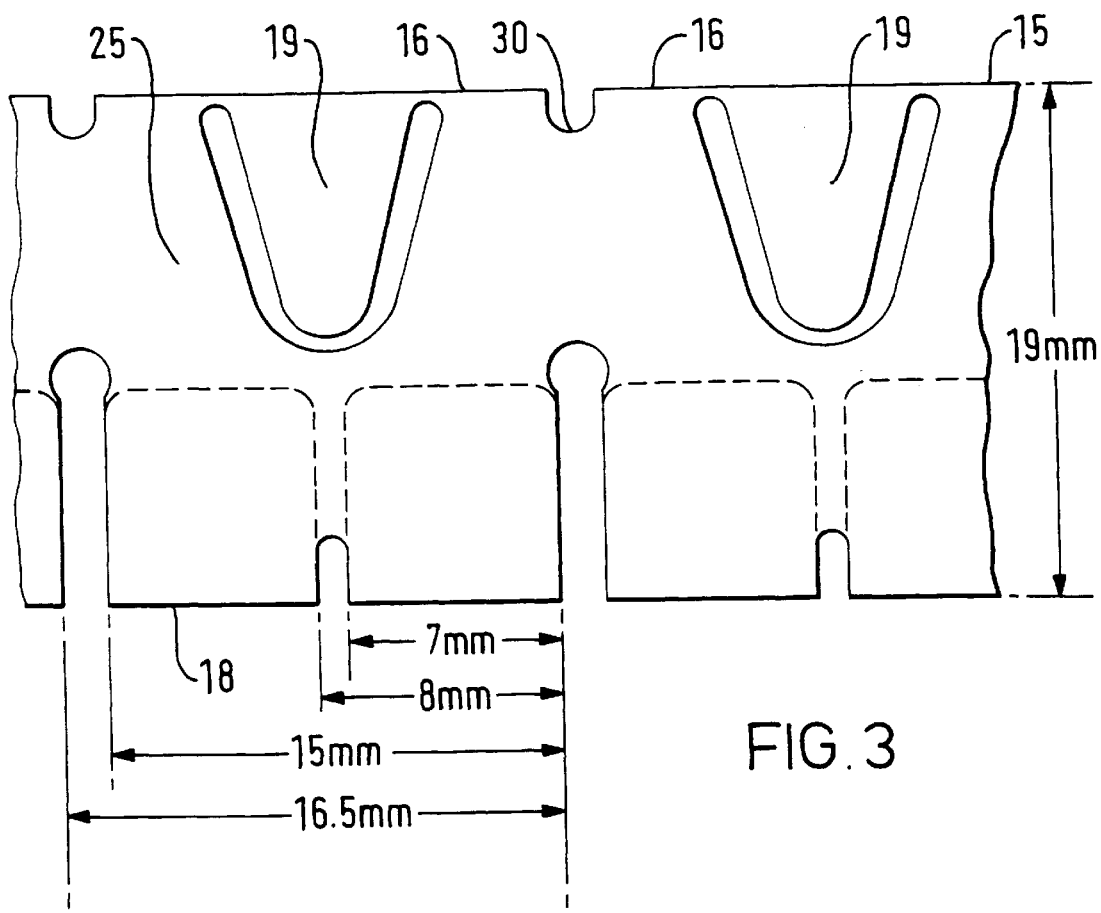
FIG. 3 is a front view of the contact strip on arrow B of FIG. 2.
Figure 4:
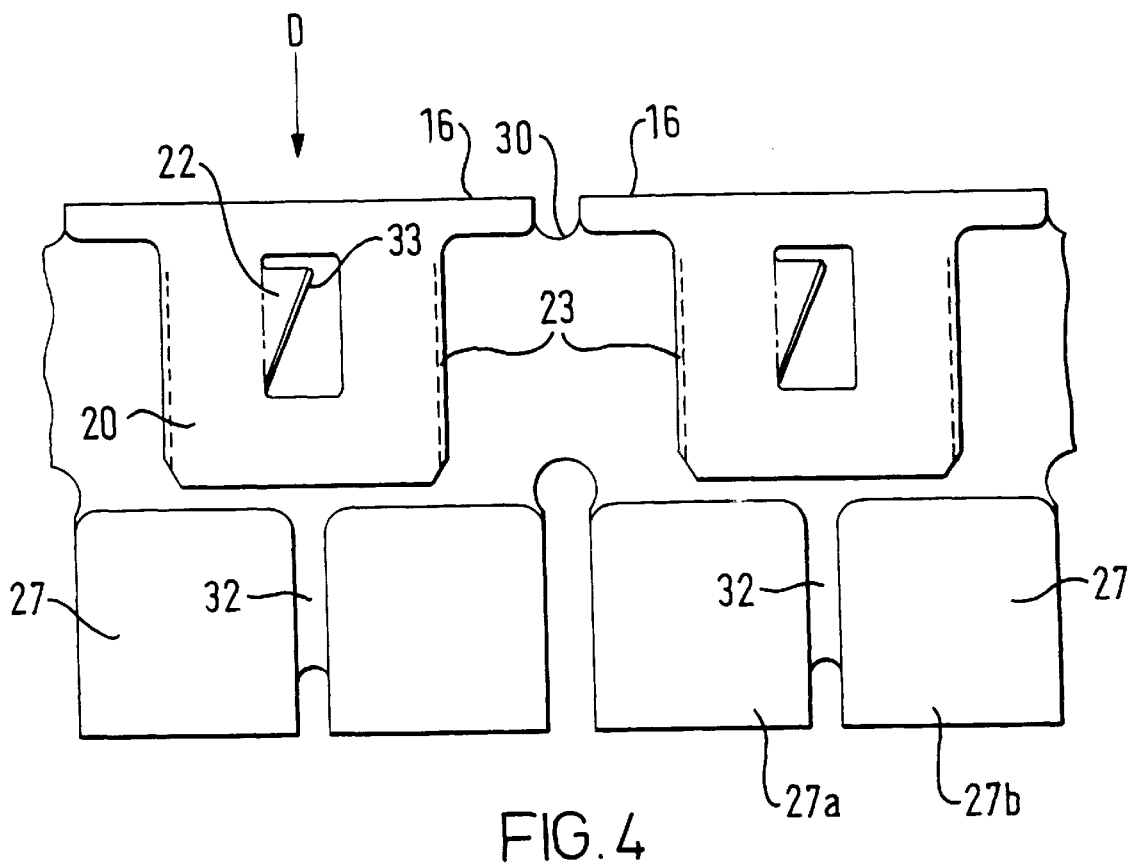
FIG. 4 is a rear view of the contact strip on arrow C of FIG. 2.

FIG. 3 is a front view of the contact strip on arrow B in FIG. 2, and FIG. 4 is a rear view of the contact strip on arrow C in FIG. 2. As illustrated, the contact strip 15 includes a series of identically orientated contact members 16 integrally connected side by side to form a strip of the desired length. Each contact member 16 is interconnected by a bridge portion 30. As can be seen from FIG. 3, the front clip portion 19 of each spring clip 17 is pressed out of the metal of the first contact portion 25 of the spring leaf 18. As best seen in FIG. 4, the second contact portion 27 of each spring leaf 18 is divided into two sections 27a and 27b separated by a slot 32 which extends round bend 26 of the spring leaf and partially into the first contact portion 25. The sections 27a, 27b spring leaf 18 are therefore independently compressible towards the first contact portion 25 of the spring leaf. This provides for reliable contact with the housing along the length of the strip in use.

Figure 5:
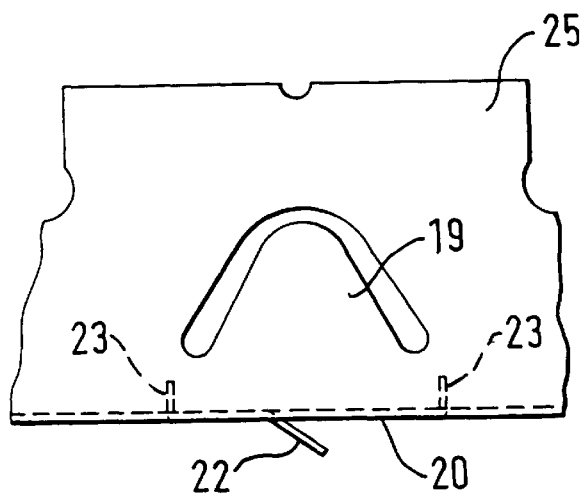
FIG. 5 is a partial view on arrow D in FIG. 4.

The rear portion 20 of the spring clip 17 is best seen in FIGS. 4 and 5. FIG. 5 shows a view on arrow D of FIG. 4. The catch 22 is formed as a raised triangle of material pressed out of the plane of rear clip portion 20 and provides an inclined edge 33 to facilitate mounting of the spring clip as discussed further below. The lateral edges of the rear clip portion 20 are turned inwardly to form the spacers 23.

In this preferred embodiment, the strip 15 is produced by pressing and forming a stainless steel strip which can then be cut to the desired length (ie. desired number of contact members 16) or may be supplied in various standard lengths. In this example, the thickness of the steel sheet of which the strip is formed is about 0.18 mm and the approximate dimensions of the contact members are shown in FIG. 3.

Figure 1:
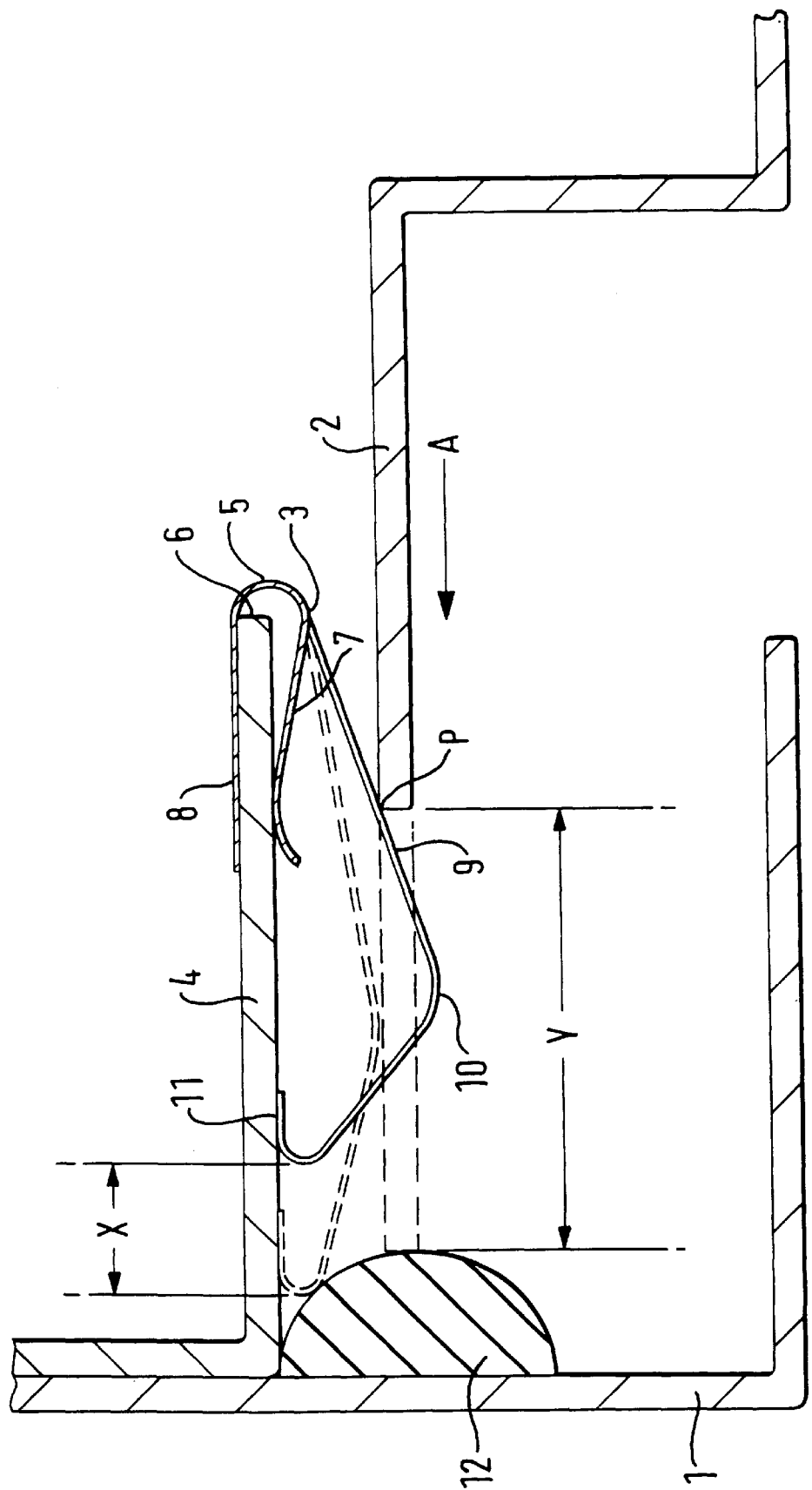
FIG. 1 is a schematic illustration of part of a housing assembly with a known contact strip.
Figure 6:
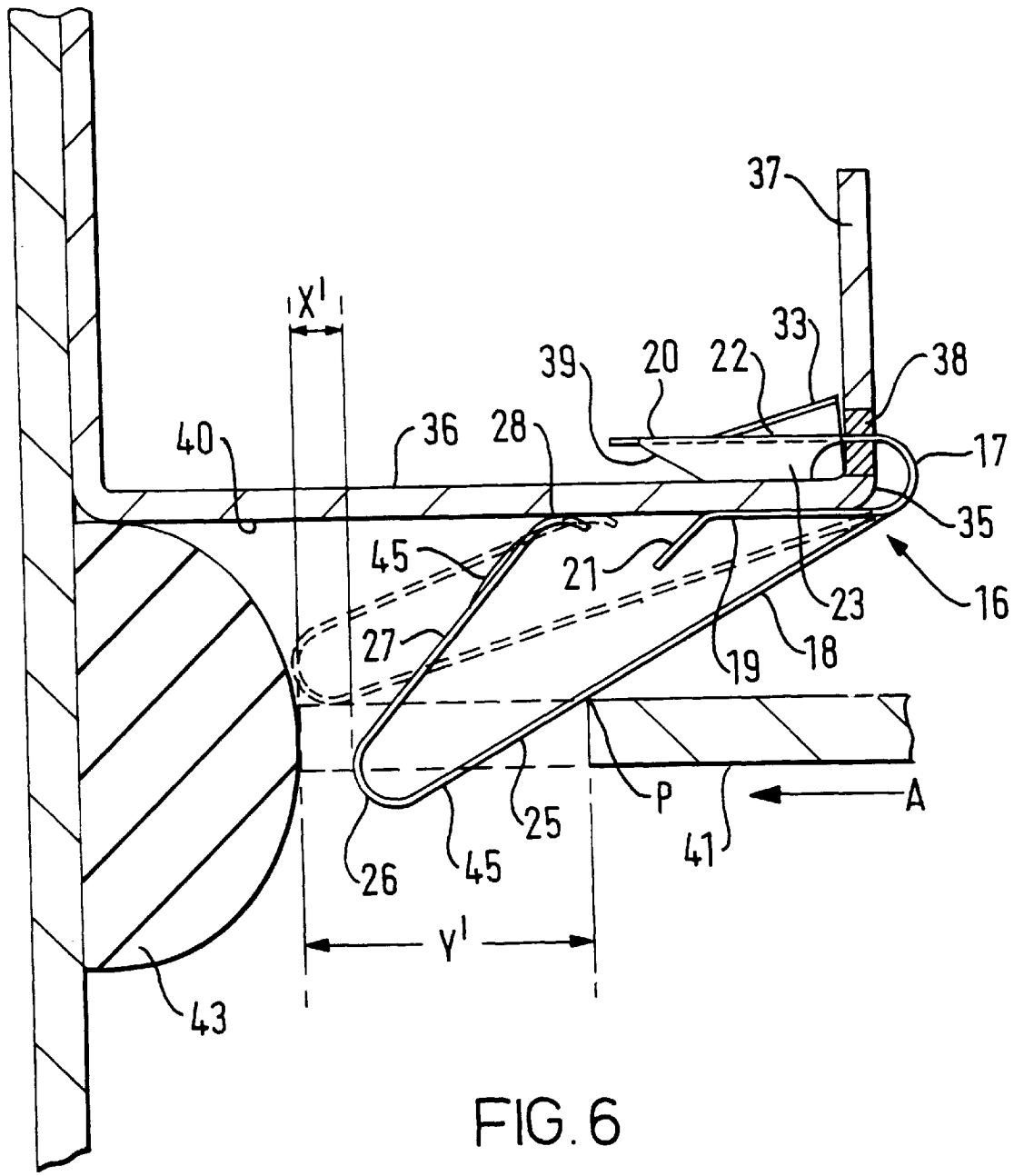
FIG. 6 is a cross-section through part of a housing assembly with the contact strip of FIG. 2 mounted thereon.

FIG. 6 shows a view, similar to FIG. 1, of the strip 15 mounted in a housing assembly, with one contact member 16 being shown in side view. Thus, the contact strip is mounted over an edge 35 of an element of a door frame 36 of a housing such as a cabinet for electronic equipment. In this preferred embodiment, however, the frame element 36 has a flange 37 with a slot 38 therein adjacent the edge 35 over which the spring clip 17 is mounted. The rear portion 20 of the spring clip 17 is inserted through the slot 38 to mount the contact member 16 on the frame element 36. A plurality of slots 38 are provided over the height of the flange 37 for receiving the rear clip portions 20 of the spring clips of adjacent contact members in the strip 15. As the rear portion 20 of the spring clip is inserted through the slot 38, the inclined edges 39 of the spacers 23 ride up over the lower edge of the slot, and the inclined end 21 of the front clip portion 19 rides over the lower corner of the edge 35 of the frame element so that the front and rear portions of the spring clip are forced apart. Further, the inclined edge 33 of the triangular catch 22 is forced against the upper edge of the slot 38, thus compressing the catch 22 towards the rear clip portion 20. When the catch 22 has cleared the slot 38, it springs back away from the rear clip portion 20 above the upper edge of the slot 38 to inhibit removal of the spring clip 17 by abutment of the catch with the flange 37.

When inserted as shown in FIG. 6, the frame element 36 is gripped between the front clip portion 19 and the spacers 23 of the rear clip portion 20. The spacers 23 enable a firm clamping effect to be achieved with the spring clip without requiring too small a radius of curvature of the spring clip around the edge 35. Very small radii of curvature can be difficult to achieve with sheet metal such as stainless steel, and the spacers 23 in this embodiment thus alleviate this constraint while still providing a firm clamping action.

With the spring clip mounted on the frame element 36, the spring leaf 18 is orientated as shown in solid lines, with the curved end 28 of the second contact portion 27 engaging the front surface 40 of the frame element. As the door 41 is closed in the direction of the arrow A in FIG. 6, the edge of the door first contacts the spring leaf 18 at contact point P. As the door continues to close, the edge rides along spring leaf 18 towards bend 26. Since the curved end 28 of the spring leaf is in contact with surface 40 of the frame, the first and second contact portions 25 and 27 are compressed towards one another between surface 40 and the door 41. During this process the free end 28 of the spring leaf rides along surface 40 towards the spring clip 17. When the door is fully closed and engages the rubber stop 43, the position of the spring leaf 18 is as shown in broken lines in the figure.

As will be seen from FIG. 6, because the second contact portion 27 of the spring leaf 18 extends from the bend 26 back towards the spring clip 17 such that the first and second contact portions 25, 27 are compressed towards one another as the door 41 is closed, the clearance required for forward travel of the spring leaf is substantially reduced as compared with the FIG. 1 arrangement. That is, the distance X' moved by the bend 26 of the spring leaf in the direction of forward travel is substantially less than the corresponding distance X in the FIG. 1 arrangement. Accordingly, the required distance of forward travel Y' of the door 41 is substantially reduced in the FIG. 6 arrangement. In particular, the distance Y' is reduced to a level which can easily be achieved by a 90° turn of a door handle in a latching mechanism for the door. Moreover, it will be appreciated that the arrangement of the spring leaf 18 provides improved resilient contact between the spring leaf and adjacent surfaces of the door and frame since the contact portions 25 and 27 are compressed towards one another in the closed configuration.

In the example of FIG. 6, with the door in the closed position the second contact portion 27 of the spring leaf is still inclined relative to the surface 40 of the frame 36. It will be appreciated that, in another arrangements, if the spacing of the components 41, 36 is reduced, the contact portion 27 may be forced further towards the surface 40, and may even lie flush against the surface 40 as a limiting position. While the distance X' would then be slightly greater, it will be still be far less than the equivalent distance with the arrangement of FIG. 1.

While operation of the contact strip 15 has been particularly described with reference to a door and door frame of a housing assembly, it will be appreciated that the contact strip is equally suitable for electrically connecting other housing components, such as panels and framework structures as well as doors, the benefits of space saving and improved resilience applying equally in these cases.

Many other variations and modifications may be made to the specific embodiment described above without departing from the scope of the invention. For example, contact dimples may be provided on the spring leaf 18 to provide more pronounced contact surfaces for engaging the surfaces of the two housing components in use. Such contact dimples are illustrated at 45 in FIG. 6 as an example, and two such dimples may be provided on each of the first and second contact portions 25, 27, symmetrically arranged on either side of the slot 32.

We Claim:

1. A contact member for providing electrical connection between two components of a housing, the contact member comprising:

a spring clip for mounting the contact member over an edge of a first of the two components, the spring clip having integrally connected front and rear portions for gripping the first of the two components therebetween; and a spring leaf integrally connected with the spring clip, the spring leaf having a generally U-shaped cross-section comprising a first contact portion, which extends away from the spring clip to a bight of the U-shaped cross-section at an acute angle to the first component when the first component is gripped by the spring clip and can contact a second of the two components of the housing in use, and a second contact portion which extends back from said bight of the U-shaped cross-section towards the spring clip to contact the first housing component in use, wherein the first and second contact portions are resiliently compressible towards one another to provide a resilient connection between the two housing components.

2. A contact member as claimed in claim 1, wherein the free end of the second contact portion of the spring leaf is curved inwardly towards the first contact portion.

3. A contact member as claimed in claim 1, wherein the front portion of the spring clip is formed of a section pressed out of the first contact portion of the spring leaf.

4. A contact member as claimed in claim 1, wherein the contact member is formed by pressing and shaping a metal sheet.

5. A contact member as claimed in claim 1, wherein the spring clip includes a catch arranged to abut part of the first housing component when the clip is mounted thereon to inhibit removal of the spring clip.

6. A contact member as claimed in claim 5, wherein the rear portion of the spring clip is arranged to be inserted through a slot in a flange adjacent the edge of the first housing component, and wherein the catch is provided on the rear portion of the spring clip as a resilient projection which is compressible on insertion through said slot and springs back on clearing the slot to inhibit removal of the spring clip by abutment with the flange.

7. A contact member as claimed in claim 1, wherein spacer means are provided on at least one of the front and rear portions of the spring clip for spacing said portion from the surface of the first housing component engaged thereby.

8. A contact member as claimed in claim 7, wherein the spacer means are provided by an inwardly turned edge or edges of said portion of the spring clip.

9. A contact member as claimed in claim 7, wherein the spacer means are provided on the rear portion of the spring clip.

10. A contact member as claimed in claim 1, wherein at least the second contact portion of the spring leaf is divided into at least two sections which are independently resiliently compressible towards the first contact portion.

11. A contact member as claimed in claim 10, wherein the second contact portion of the spring leaf is divided into two sections arranged symmetrically with respect to the spring clip.

12. A contact strip comprising a plurality of contact members as claimed in claim 1, the contact members being integrally connected side by side to form a row of identically orientated contact members.

13. A contact strip as claimed in claim 12, which is formed by pressing and shaping a metal sheet.

14. A housing assembly comprising:

a first housing component having a contact strip as claimed in claim 13 mounted over an edge thereof such that the second contact portion of each contact member contacts a surface of the first housing component; and a second housing component locatable relative to the first housing component such that a surface of the second housing component faces said surface of the first housing component and makes contact with the first contact portions of the contact members such that the first and second contact portions of each contact member are compressed towards one another by said surfaces.

15. A housing assembly as claimed in claim 14 wherein each of said first and second housing components is a door or panel or frame element of a housing for electronic equipment.

* * * * *